(12) United States Patent
Kawakami

(10) Patent No.: US 8,770,964 B2
(45) Date of Patent: Jul. 8, 2014

(54) IMPRINT APPARATUS AND ARTICLE MANUFACTURING METHOD

(75) Inventor: Eigo Kawakami, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 351 days.

(21) Appl. No.: 13/004,469

(22) Filed: Jan. 11, 2011

(65) Prior Publication Data
US 2011/0169181 A1 Jul. 14, 2011

(30) Foreign Application Priority Data

Jan. 12, 2010 (JP) ................................ 2010-004445

(51) Int. Cl.
*B29C 59/00* (2006.01)
(52) U.S. Cl.
USPC ............ 425/385; 425/169; 425/150; 425/171; 425/170; 425/139; 425/149; 264/40.1; 264/293
(58) Field of Classification Search
USPC ......... 425/149, 150, 171, 170, 169, 139, 385; 264/40.5, 40.1, 293; 700/197–204, 700/206, 121; 977/887
See application file for complete search history.

(56) References Cited

U.S. PATENT DOCUMENTS

| 2005/0275125 A1* | 12/2005 | Kawakami et al. | ........... 264/40.5 |
| 2007/0145639 A1* | 6/2007 | Seki et al. | ...................... 264/293 |

FOREIGN PATENT DOCUMENTS

| JP | 2005-533393 A | 11/2005 |
| JP | 2008-246729 A | 10/2008 |
| WO | 2004/016406 A1 | 2/2004 |
| WO | WO 2008129962 A1 * | 10/2008 ............... B29C 33/58 |

* cited by examiner

*Primary Examiner* — Amjad Abraham
*Assistant Examiner* — Ninh Le
(74) *Attorney, Agent, or Firm* — Rossi, Kimms & McDowell LLP

(57) ABSTRACT

An imprint apparatus includes: a support member which supports the mold; a substrate stage which supports the substrate; a detector which detects a force applied to the mold; a mechanism which forms a space for removing the mold supported by the support member, between the support member and the substrate stage, and a controller. The controller determines a release force required to detach the mold from the cured resin, based on a detection result from the detector, compares the determined release force with a first threshold value, and causes the mechanism to form the space if the determined release force is larger than the first threshold value.

7 Claims, 11 Drawing Sheets

IMPRINT APPARATUS AND ARTICLE MANUFACTURING METHOD

BACKGROUND OF THE INVENTION

1. Field of the Invention

The present invention relates to an imprint apparatus for transferring a mold pattern as an original onto a substrate such as a wafer, and an article manufacturing method using the imprint apparatus.

2. Description of the Related Art

The imprint technique is already known as a technique replacing a method of forming fine patterns on semiconductor devices by using ultraviolet, X-ray, or electron-beam photolithography. In the imprint technique, a mold having a fine pattern is pressed (imprinted) against a substrate such as a wafer coated with a resin material (a wafer on which the resin material is dispensed) by, for example, electron-beam exposure, thereby transferring the pattern onto the resin. Imprinting has several types of methods. As one method, the photo-curing method is proposed in, for example, Japanese Patent Laid-Open No. 2005-533393. In the photo-curing method, while a transparent mold is pressed against a resin with which a substrate is coated, the resin is cured by irradiation with ultraviolet light, and the mold is detached (released) from the cured resin. The imprint technique using this photo-curing method is suitable for the manufacture of semiconductor integrated circuits because temperature control is relatively easy to perform and an alignment mark on the substrate can be observed through the transparent mold. Also, when overlaying different patterns, it is possible to apply the step-and-repeat method by which a mold matching the chip size of a device to be manufactured is formed and the patterns are sequentially transferred onto shots on a substrate.

In the imprint technique, mold release by which the mold is detached from the cured resin is generally regarded as a problem. If the mold is forcedly detached from the resin while the releasability is low, the mold may be damaged, and this sometimes decreases the durability of the imprint apparatus. Japanese Patent Laid-Open No. 2008-246729 discloses a method of detecting the release force, determining the presence/absence of abnormality by comparing the detected release force with a threshold value, and, if abnormality is found, improving the releasability by, for example, heating a mold.

SUMMARY OF THE INVENTION

If the releasability of a mold decreases, a pattern formed on a resin may break or clogging may occur in recesses of the mold when releasing it. To avoid these events, it is necessary to collect the mold, clean it, and recoat it with a release agent, after an imprint operation is performed a defined number of times. It is desirable to use the mold as long as possible because it requires much labor and time to collect and clean the mold and recoat it with the release agent. Depending on the conditions of imprinting, however, the above-described problems may arise before the defined number of times is reached. This makes it difficult to determine a proper timing of mold replacement.

The present invention provides an imprint apparatus capable of determining a proper timing of mold replacement.

According to one aspect of the present invention, there is provided an imprint apparatus for performing, for each shot of a substrate, an imprint operation of coating the substrate with a resin, and curing the resin while the resin is in contact with a pattern surface of a mold, the apparatus comprising: a support member which supports the mold; a substrate stage which supports the substrate; a detector which detects a force applied to the mold; a mechanism which forms a space for removing the mold supported by the support member, between the support member and the substrate stage, and a controller, wherein the controller determines a release force required to detach the mold from the cured resin, based on a detection result from the detector, compares the determined release force with a first threshold value, and causes the mechanism to form the space if the determined release force is larger than the first threshold value.

Further features of the present invention will become apparent from the following description of exemplary embodiments with reference to the attached drawings.

DESCRIPTION OF THE EMBODIMENTS

An imprint apparatus using the photo-curing method according to the present invention will be explained below with reference to the accompanying drawings.

[First Embodiment]

Figure 1:
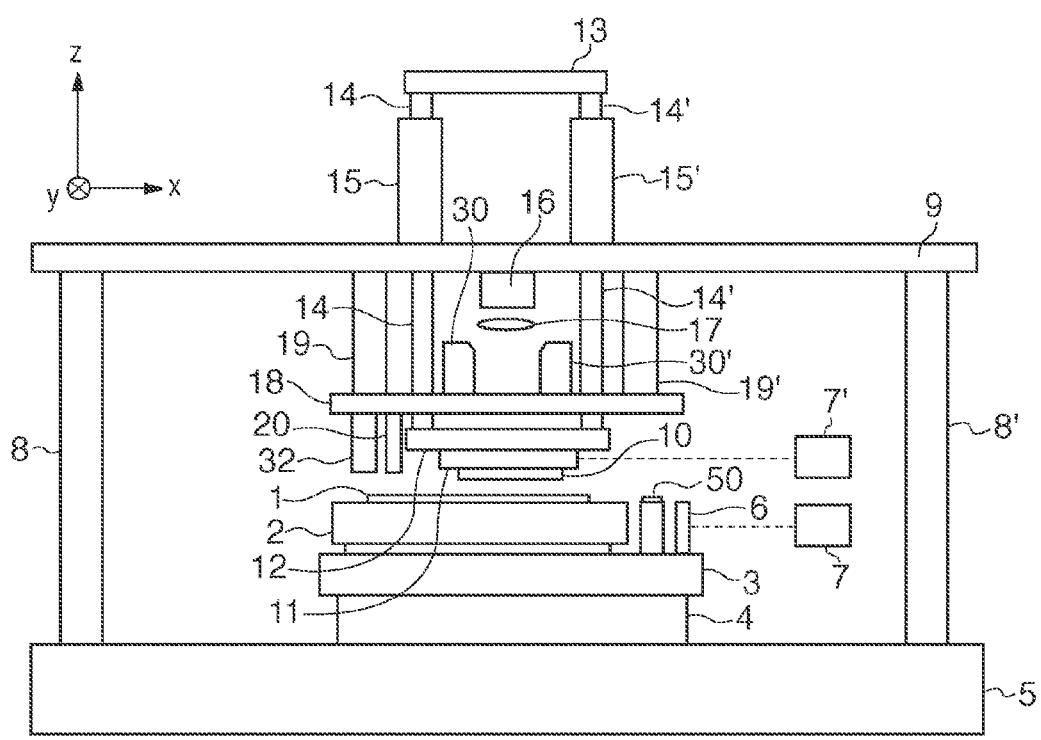
FIG. 1 is a view showing the arrangement of an imprint apparatus.
Figure 2:
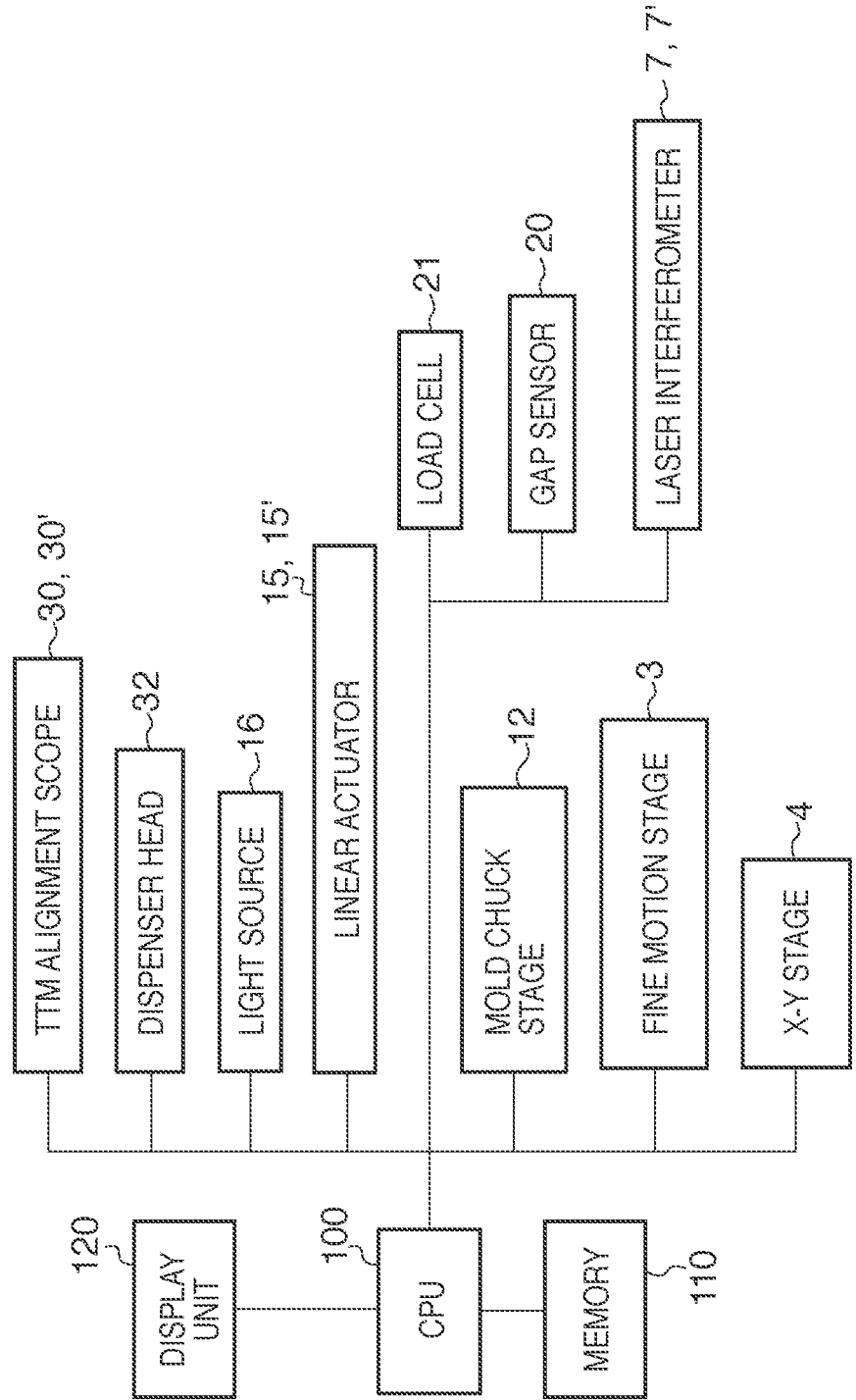
FIG. 2 is a control block diagram of the imprint apparatus.

FIG. 1 is a view showing the arrangement of the imprint apparatus. FIG. 2 is a control block diagram of the imprint apparatus. The imprint apparatus performs, for each shot of a substrate, an imprint operation of coating the substrate with a resin, and curing the resin while pressing a mold against the resin.

Referring to FIGS. 1 and 2, a substrate 1 such as a wafer is held by a substrate chuck 2. A fine motion stage 3 has a function of correcting the position of the substrate 1 in a θ direction (rotation around the z-axis), a function of adjusting the z position of the substrate 1, and a tilt function of correcting the tilt of the substrate 1. The fine motion stage 3 is placed on an X-Y stage 4 for positioning the substrate 1 in a predetermined position. The fine motion stage 3 and X-Y stage 4 will collectively be referred to as a substrate stage for supporting the substrate 1. The X-Y stage 4 is placed on a base surface plate 5. Reference mirrors 6 are attached on the fine motion stage 3 in the x and y directions (a reference mirror in the y direction is not shown), and reflect light from a laser interferometer 7 in order to measure the position of the fine motion stage 3. Support posts 8 and 8' stand on the base surface plate 5, and support a top plate 9. A mold 10 is fixed to a mold chuck 11 by a mechanical holding mechanism (not shown). The mold chuck 11 forms a support member for supporting the mold 10. A three-dimensional pattern to be transferred onto the substrate 1 is formed on the surface of the mold 10. The mold chuck 11 is mounted on a mold chuck stage 12 by a mechanical holding mechanism (not shown).

The mold chuck stage 12 has a function of correcting the position of the mold 10 (or the mold chuck 11) in the direction of rotation (θ) around the z-axis, and a tilt function of correcting the tilt of the mold 10. The mold chuck 11 has reflecting surfaces for reflecting light from a laser interferometer 7' in order to measure the positions of the mold chuck 11 in the x and y directions. A reflecting surface in the y direction is not shown. The mold chuck 11 and mold chuck stage 12 have openings (not shown) for passing ultraviolet light irradiated from a light source 16 through a collimator lens 17 to the mold 10. Guide bars 14 and 14' extend through the top plate 9, and each have one end fixed to the mold chuck stage 12. A guide bar plate 13 fixes the other end of each of the guide bars 14 and 14'.

Linear actuators 15 and 15' for raising and lowering the mold are air cylinders or linear motors, and drive the guide bars 14 and 14' in the z direction shown in FIG. 1, thereby pressing the mold 10 held by the mold chuck 11 against the substrate 1 or detaching the mold 10 from the substrate 1. The linear actuators 15 and 15' form a driving mechanism for driving the support member for supporting the mold 10. The linear actuators 15 and 15' also form a mechanism for forming a space for removing the mold 10 supported by the support member, between the support member for supporting the mold and the substrate stages 3 and 4. Note that the space formation mechanism can also be the driving mechanism for driving the substrate stages 3 and 4, instead of the linear actuators 15 and 15'. The guide bars 14 and 14' extend through an alignment shelf 18 suspended from the top plate 9 by support posts 19 and 19'. A gap sensor 20 such as a capacitance sensor measures the height (flatness) of the substrate 1 on the substrate chuck 2.

A plurality of load cells 21 (not shown in FIG. 1) are detectors that are attached to the mold chuck 11 or mold chuck stage 12, and measure the forces applied to the mold 10 when pressing the mold 10 against the substrate 1 and detaching the mold 10 from the substrate 1. Note that the detector for measuring the force applied to the mold 10 can also be a strain gauge attached to the mold 10.

TTM (Through The Mold) alignment scopes 30 and 30' for die-by-die alignment each include an optical system and imaging system for observing alignment marks formed on the substrate 1 and mold 10. The TTM alignment scopes 30 and 30' measure the displacements of the substrate 1 and mold 10 in the x and y directions. A dispenser head 32 include a resin dropping nozzle for dropping a photo-curing liquid resin on the surface of the substrate 1. A reference mark 50 is formed on a reference mark table on the fine motion stage 3. A CPU (controller) 100 comprehensively controls the above-mentioned actuators and sensors, thereby causing the imprint apparatus to perform a predetermined operation. A memory (storage unit) 110 stores the transfer log of the mold 10, which includes the change in release force when executing the imprint operation, and data concerning the release force necessary to determine the mold replacement timing. A display unit 120 displays a message prompting the replacement of the mold 10, and the occurrence of a resin incomplete filling, as will be described later.

Figure 3:
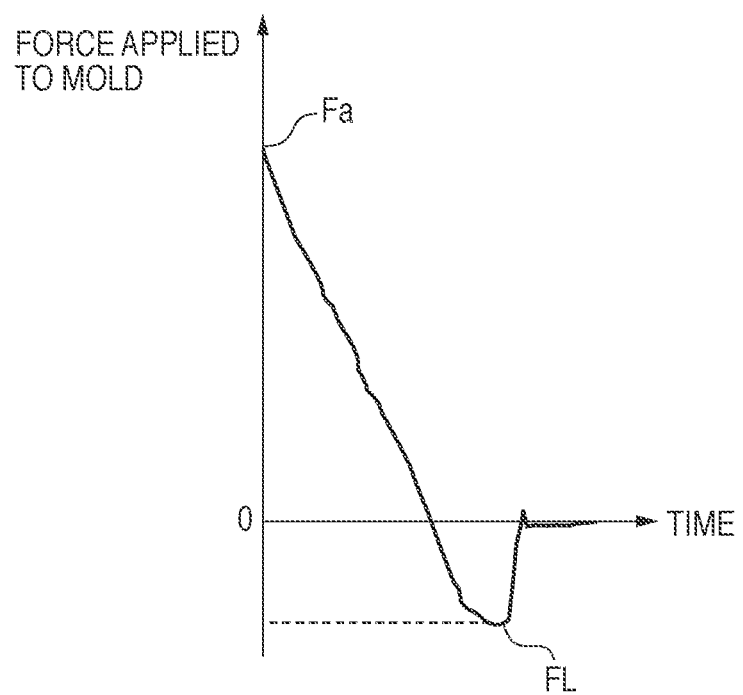
FIG. 3 is a graph showing the change in force applied to a mold during mold release as a function of time.

The operation of the imprint apparatus when forming a semiconductor device will be explained below with reference to FIGS. 1 to 5. FIG. 3 is a graph showing an example of the change in force applied to the mold 10 during mold release and measured by the load cells 21 as a function of time. Referring to FIG. 3, the absolute value of a maximum value of a force acting toward the negative side will be called a release force FL.

Figure 4:
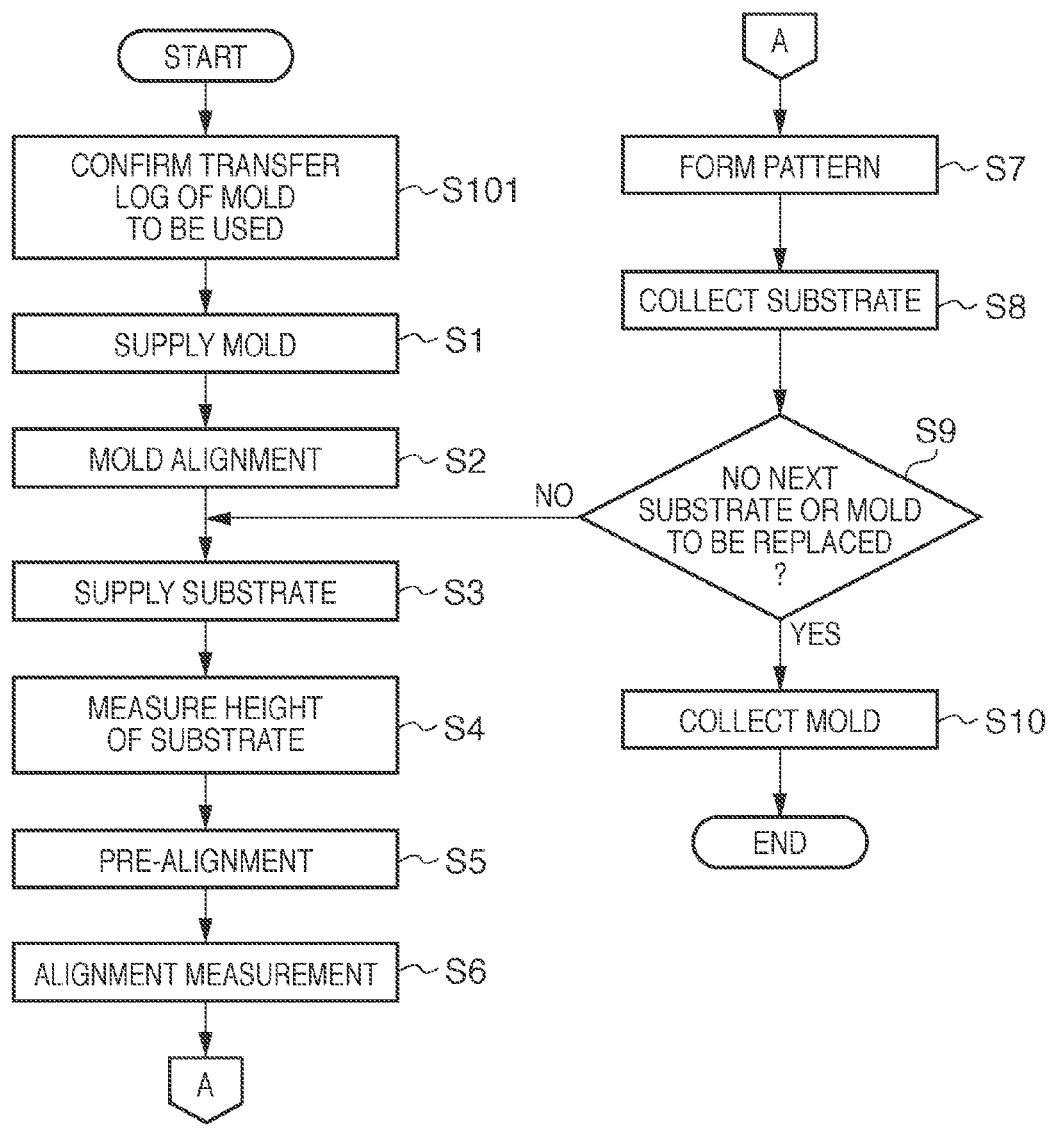
FIG. 4 is a flowchart of an imprint operation for a plurality of substrates.

FIG. 4 is a flowchart of the first embodiment in which the imprint operation is executed by using the same mold 10 for a plurality of substrates 1. In S101, the CPU 100 confirms a reference release force F0 of a mold to be used, from the transfer log of each mold stored in the memory 110. The reference release force F0 is a release force obtained by performing pre-imprinting by controlling the conditions such as the substrate 1 or a base to be used, the mold 10, a release agent, a resin, the mold pressing load, the mold pressing time, the ultraviolet irradiation time, and the mold detaching rate during mold release. In this pre-imprinting, imprinting needs not to be performed for all shots on the substrate. For example, imprinting is performed for a plurality of shots near the center of the substrate in a shot layout shown in FIG. 6, and the average value or maximum value of the obtained release forces is stored as the reference release force F0 in the memory 110. When the mold 10 is cleaned or coated with a release agent, the value of the reference release force F0 is updated by performing similar pre-imprinting.

Then, in S1, a mold conveyance mechanism (not shown) supplies the mold 10 to the mold chuck 11. In S2, the TTM alignment scopes 30 and 30' simultaneously observe the alignment mark (not shown) of the mold 10 and the reference mark 50 on the fine motion stage 3. By using the observation results, the mold chuck stage 12 mainly aligns the position of the mold 10 in the θ direction (rotation around the z-axis). In S3, a substrate conveyance mechanism (not shown) supplies the substrate 1 to the substrate chuck 2. Subsequently, in S4, the CPU 100 drives the X-Y stage 4 to measure the height (flatness) of the entire surface of the substrate 1 by the gap sensor 20. As will be described later, this measurement data is used to align a shot surface in which the imprint operation is to be performed on the substrate 1 with a reference plane when imprinting the mold 10.

In S5, a pre-alignment measuring device (not shown) images and observes a pre-alignment mark (not shown) preformed on the substrate 1. The displacements in the x and y directions of the substrate 1 with respect to the imprint apparatus are measured by image processing, and the position of the substrate 1 in the θ direction (rotation around the z-axis) is corrected based on the measurement results. In S6, the TTM alignment scopes 30 and 30' are used to simultaneously observe the alignment mark (not shown) on the mold 10 and the alignment mark (not shown) on the substrate 1 in a specific sample shot (not shown) on the substrate 1. Then, the relative displacement amounts in the x and y directions are measured. The displacement in the θ direction (rotation around the z-axis) is calculated from these displacements in the x and y directions. From the results of measurements performed for the sample shot by the TTM alignment scopes, the displacements in the X, Y, and θ directions of each shot on the substrate 1 are predicted, and a substrate stage alignment target position when transferring a pattern to each shot is determined. This method is the same as the method of global alignment measurement used in a step-and-repeat exposure apparatus.

Figure 5:
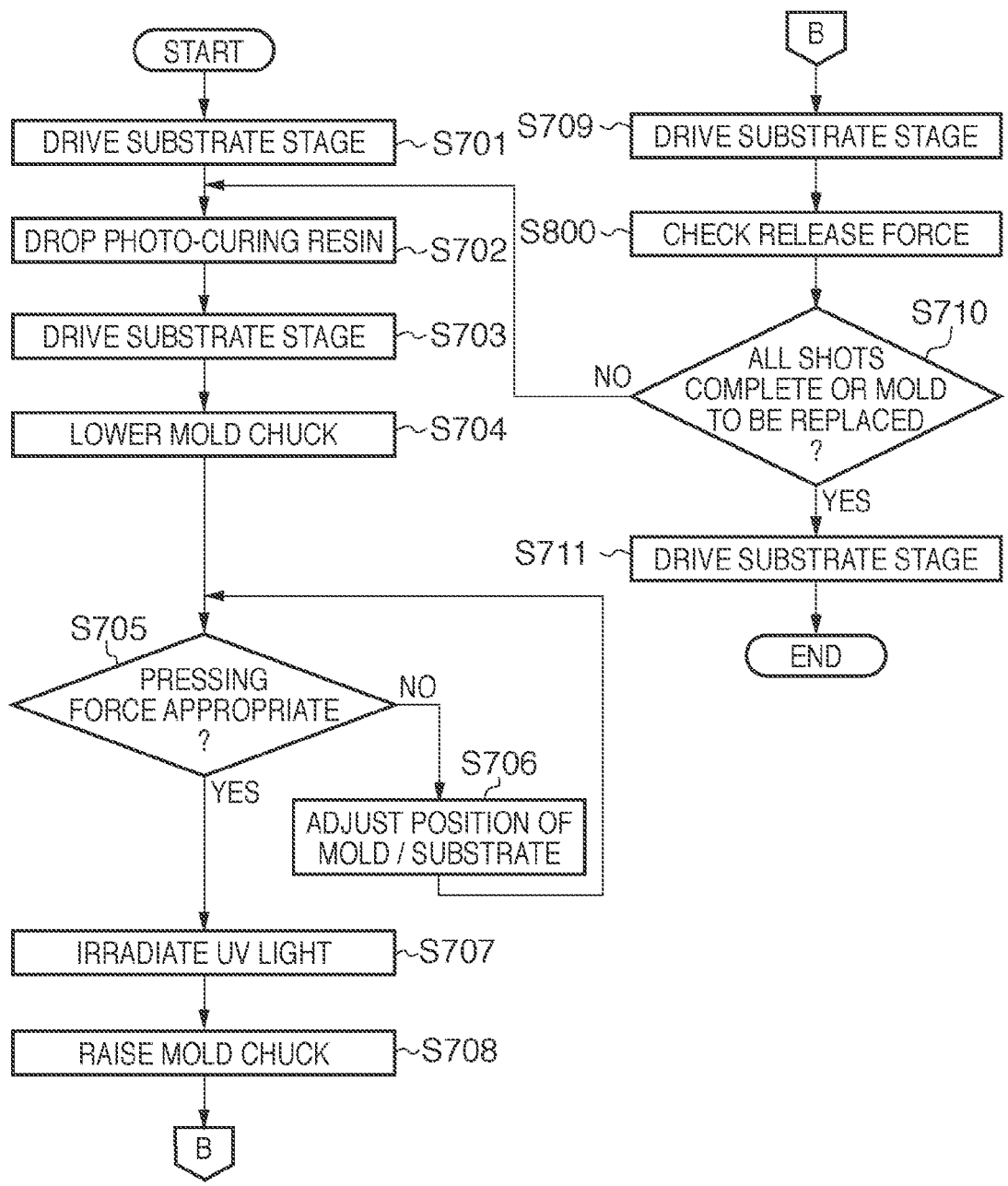
FIG. 5 is a flowchart of an imprint operation for one substrate.

In S7, an imprint operation shown in a flowchart of FIG. 5 is performed for each shot on the substrate 1. When the imprint operation for all shots is complete, the substrate conveyance mechanism (not shown) collects the substrate 1 from the substrate chuck 2 in S8. In S9, the CPU 100 determines whether there is a substrate to be imprinted next. If there is a substrate to be imprinted next, the CPU 100 compares the number of imprintable shots with the number of imprinting target shots of the next substrate. If there is a substrate to be imprinted next and the number of imprintable shots is larger than the number of imprinting target shots of the next substrate, the process returns to S3. If there is no substrate to be imprinted next, or if the mold is to be replaced in S7 as will be described later, the process advances to S10. Finally, in S10, the mold transfer mechanism (not shown) collects the mold 10 from the mold chuck 11, thereby completing the imprinting for the plurality of substrates.

FIG. 5 is a flowchart of an imprint operation for one substrate, and corresponds to S7 in FIG. 4. The imprint operation will be explained below with reference to FIGS. 1, 2, and 5. In S701 of FIG. 5, the CPU 100 drives the X-Y stage 4 to move the substrate chuck 2 on which the substrate 1 is placed, thereby moving a imprinting target shot on the substrate 1 to a position below the dispenser head 32. In S702, the dispenser head 32 drops a photo-curing resin on the target shot on the substrate 1. In S703, the CPU 100 drives the X-Y stage 4 so that the plane of the target shot comes to a position facing a three-dimensional pattern of the mold 10. In this step, the substrate stage moves to the alignment target position determined and corrected based on the results of alignment measurements in S6 of FIG. 4. In addition, the fine motion stage 3 adjusts the z-direction height and tilt of the substrate chuck 2, and aligns the surface of the target shot of the substrate 1 with the reference plane based on the above-described substrate height measurement data. In S704, the CPU 100 lowers the mold chuck 11 to a predetermined position by driving the linear actuators 15 and 15'.

In S705, the CPU 100 determines whether the pressing force of the mold 10 is appropriate based on the detection results of the plurality of load cells 21 attached to the mold chuck 11 or mold chuck stage 12. If the pressing force falls outside a predetermined range, the process branches to NO in S705, and advances to S706. In S706, the pressing force of the mold 10 is adjusted by changing the position of the mold chuck 11 in the z direction by the linear actuators 15 and 15', or changing the position of the substrate chuck 2 in the z direction by the fine motion stage 3. The loop of S705 and S706 continues until the predetermined pressing force is obtained. If it is determined in S705 that the pressing force of the mold 10 is appropriate, the process branches to YES in S705, and advances to S707. In S707, the light source 16 irradiates UV light for a predetermined time. When the irradiation of the UV light is complete, the process advances to S708, and the CPU 100 raises the mold chuck 11 by driving the linear actuators 15 and 15', thereby detaching the mold 10 from the cured resin on the substrate 1. In S709, the CPU 100 drives the X-Y stage 4, and, if there is a shot to be imprinted next, moves the substrate 1 such that the shot comes to the position below the dispenser head 32.

Figure 8:
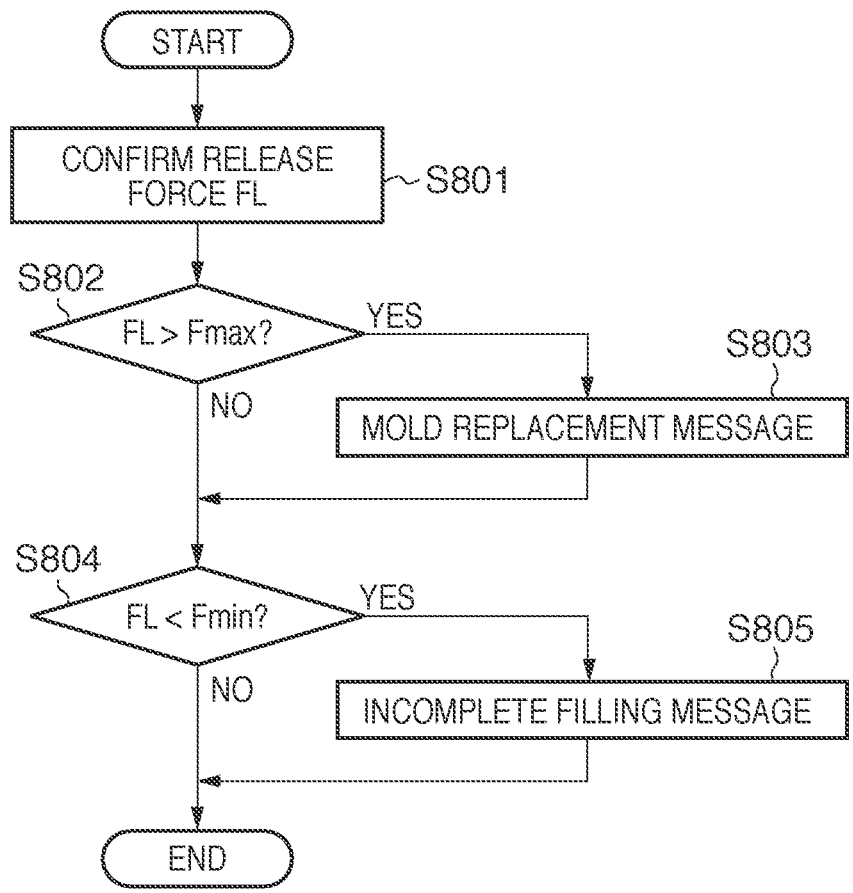
FIG. 8 is a flowchart for determining mold replacement and a resin incomplete filling.

In S800, the CPU 100 performs processing corresponding to the magnitude of the release force by a flowchart shown in FIG. 8. In S801, the CPU 100 confirms the release force (the average value or maximum value of the plurality of load cell outputs) measured by the load cells 21. Assume that the substrate 1 has the shot layout shown in FIG. 6, and peripheral shots 1, 5, 21, and 25 of the substrate 1 partially extend from the edge of the substrate and are so-called edge shots. In an edge shot, a partial region of the shot is coated with the resin, and the imprint operation is performed for the shot partial region coated with the resin. When a shot as a target of the imprint operation is an edge shot, the CPU 100 calculates the release force FL by using the force detected by the load cells 21, and the ratio of the area of a partial region coated with the resin to the area of the shot. When a shot as a target of the imprint operation is a shot whose entire region is a target of the imprint operation, the CPU 100 determines the force detected by the load cells 21 as the release force FL.

Figure 6:
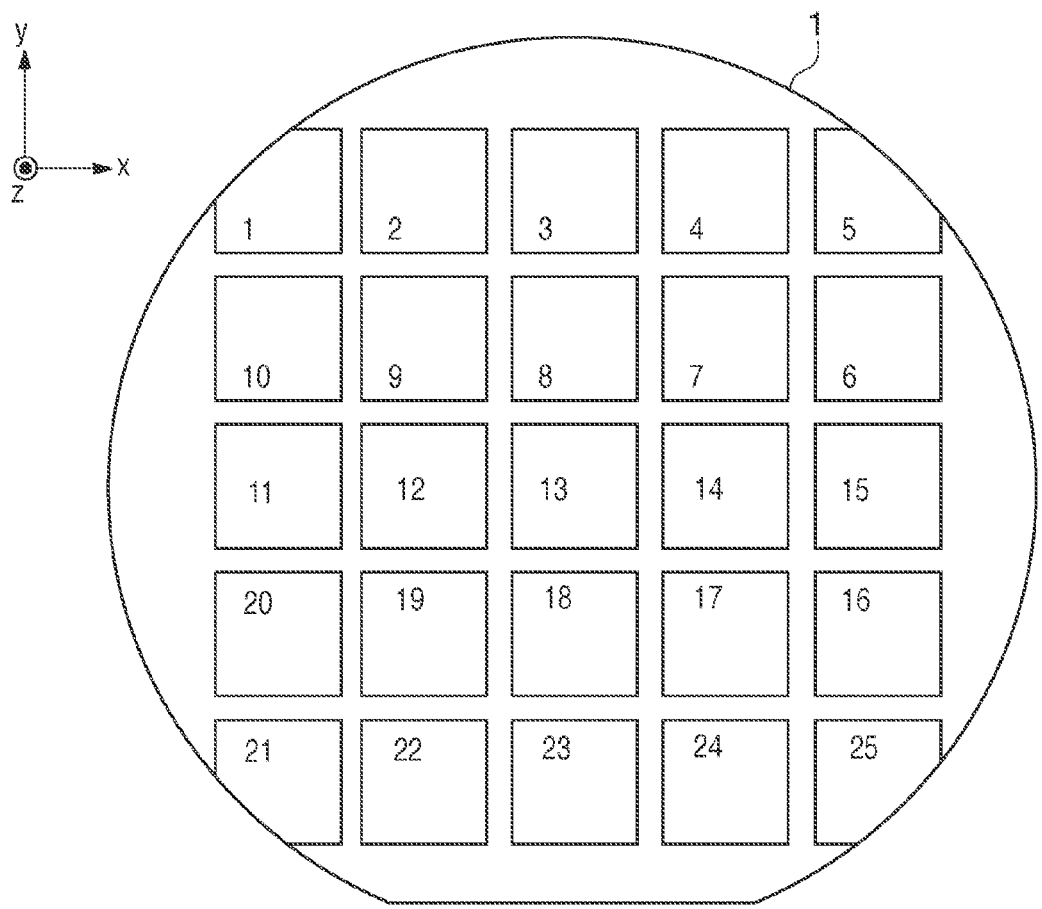
FIG. 6 is a plan view showing the layout and numbers of shots on a substrate.
Figure 7A:
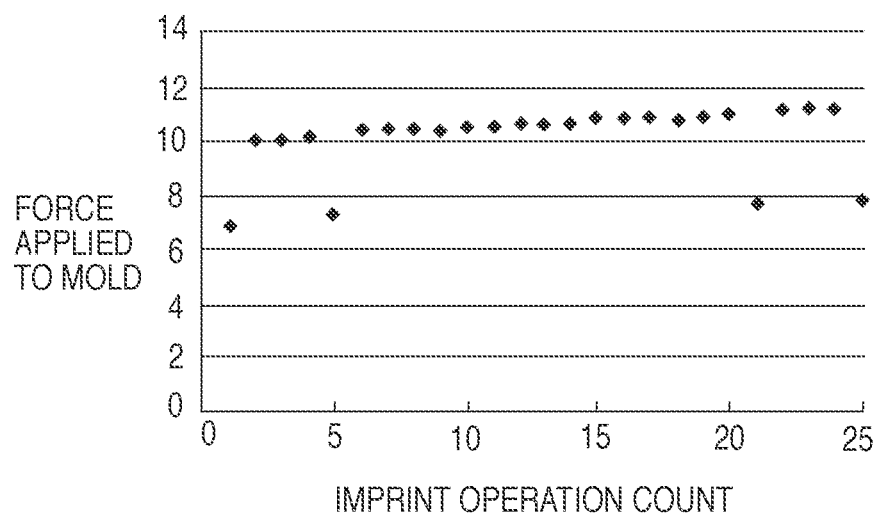
FIGS. 7A and 7B are graphs respectively showing the change in force applied to a mold and the change in release force.
Figure 7B:
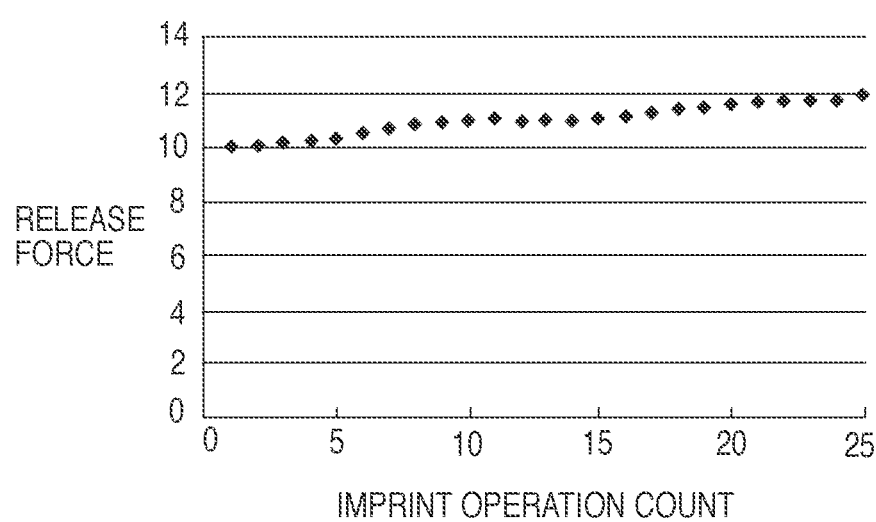

FIGS. 7A and 7B illustrate examples of the changes in release force when imprinting is performed on the shots in order of number in the shot layout shown in FIG. 6. Referring to FIGS. 7A and 7B, the abscissa indicates the imprint operation count equivalent to the shot number in FIG. 6. In FIG. 7A, the ordinate indicates the force applied to the mold 10 and detected by the load cells 21. In FIG. 7B, the ordinate indicates the release force FL in units of kgf. Referring to FIG. 7A, the area of the imprinted pattern in each of the four edge shots (shots 1, 5, 21, and 25) is smaller than that in other full-size shots. Therefore, the force applied to the mold 10 is also small in proportion to the area of the pattern in each of the four edge shots. To perform comparison based on the same release force, FIG. 7B shows the change in release force FL of each shot determined by converting the above-described shot area ratio.

In S802, the CPU 100 determines whether the release force FL is larger than a first threshold value Fmax. The first threshold value Fmax is a force indicated by (reference release force F0+α), wherein α indicates an allowable increase in release force with respect to the reference release force F0. The value of α is a maximum value within the range in which the formed pattern does not break due to peeling of the resin during mold release. Similar to the determination of the reference release force F0 described earlier, the maximum value is determined by preliminary test imprinting or the like, and stored in the memory 110. In this test imprinting, imprints are actually overlaid, and the state of the formed pattern is also checked in addition to the change in release force. If a state in which projections of the pattern formed on the substrate are broken, or peeling of the formed pattern from the substrate is beginning to be observed, α is calculated by subtracting the reference release force F0 from the release force measured at that time. The value of α need not be updated by performing test imprinting whenever the mold is washed and recoated with the release agent. The value of α to be actually used in S802 can be set smaller by 10% than α determined as described above, by taking account of measurement errors and the reproducibility of the imprint conditions. Note that the value of α is loaded together with the reference release force F0 from the memory 110 to the CPU 100 in S101, although this is omitted from the explanation of FIG. 4. If the release force FL is larger than the first threshold value Fmax (=F0+α) in S802, the CPU 100 determines that the releasability of the mold has deteriorated and the mold requires replacement, and advances the process to S803. In S803, the CPU 100 displays a message prompting the replacement of the mold on the display unit 120. In addition, the CPU 100 causes the linear actuators 15 and 15' or the substrate stage driving mechanism to form a space for removing the mold 10. If the release force FL is smaller than the first threshold value Fmax in S802, the CPU 100 determines that mold replacement is unnecessary, and advances the process to S804.

In S804, the CPU 100 compares the release force FL with a minimum release force Fmin as a second threshold value, and determines whether the release force FL is smaller than the minimum release force Fmin. The present inventor made extensive studies, and has found that if an incomplete filling by which air bubbles remain in pattern recesses of the mold 10 occurs when pressing the mold 10 against the photo-curing resin, the release force required to release the mold 10 after the resin is cured largely decreases. Therefore, a release force smaller than the reference release force F0 (for example, a release force about 60% of F0) is defined as the minimum release force Fmin. If the release force FL is smaller than the minimum release force Fmin in S804, the CPU 100 determines that an incomplete filling has occurred, and advances the process to S805. In S805, the CPU 100 displays a message indicating the occurrence of the incomplete filling on the display unit 120, and terminates the processing (S800 in FIG. 5) shown in FIG. 8. On the other hand, if the release force FL is larger than the minimum release force Fmin in S804, the CPU 100 determines that no incomplete filling has occurred, and similarly terminates the processing shown in FIG. 8.

Figure 9:
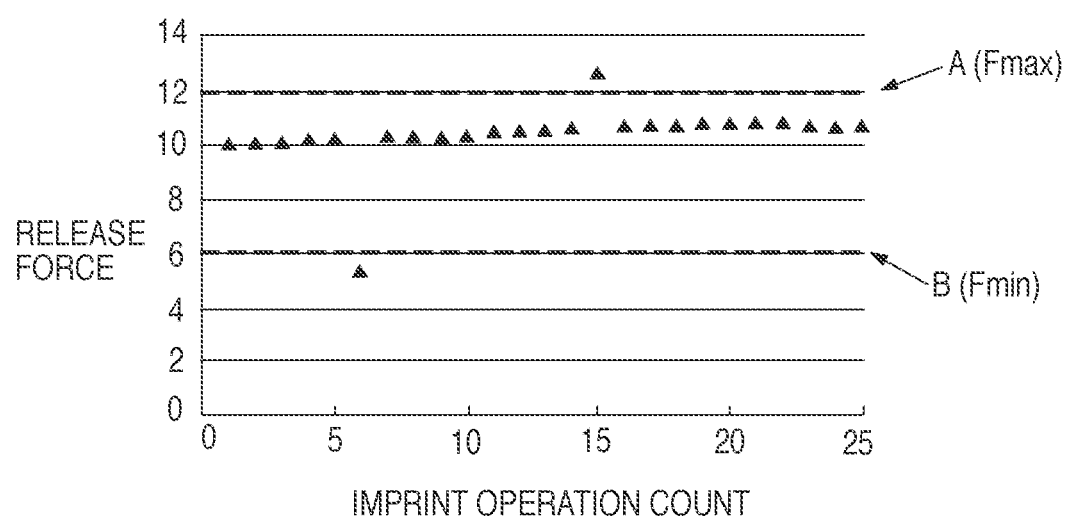
FIG. 9 is a graph for explaining a method of determining mold replacement and a resin incomplete filling.

FIG. 9 shows an example of the change in release force when the imprint operation is performed on 25 shots of one substrate. The processing shown in FIG. 8 will be explained again with reference to FIG. 9. In FIG. 9, the abscissa indicates the imprint operation count equivalent to the shot number in FIG. 6, and the ordinate indicates the release force in units of kgf. A broken line A indicates the first threshold value Fmax as the determination criterion of mold replacement, and a broken line B indicates the minimum release force Fmin as the determination criterion of an incomplete filling. In the example shown in FIG. 9, the processing shown in FIG. 8 determines that shot 6 has an incomplete filling and shot 15 requires mold replacement. Note that if it is determined that mold replacement is necessary, an imprint operation from shot 16 is not performed by using the same mold, so no release force is actually recorded from shot 16 shown in FIG. 9. Processing corresponding to the magnitude of the release force shown in FIG. 8, that is, S800 shown in FIG. 5 is executed as described above.

FIG. 5 will be explained again. In S710 following S800, the CPU 100 determines whether imprinting of all shots on the substrate 1 is complete, or whether mold replacement is necessary based on S800. If there is a shot to be imprinted and mold replacement is unnecessary, the process branches to NO in S710, and returns to S702. If there is no shot to be imprinted or mold replacement is necessary, the process branches to YES in S710, and advances to S711. In S711, the CPU 100 drives the X-Y stage 4 to a predetermined position in order to prepare for collection of the substrate 1 (S8 in FIG. 4).

A supplementary explanation will be given to the reference release force F0. The value of the reference release force F0 can also be a release force obtained by performing imprinting on an arbitrary shot of a first substrate, instead of performing pre-imprinting. For example, the reference release force F0 may be the release force of imprinting performed on a first full-size shot of a first substrate or on a shot near the center of a substrate. Also, if the degree of deterioration of the mold releasability is moderate compared to the imprint operation count, the release force need not be checked for each shot in S800. For example, S800 may be executed for a specific shot such as a shot near the center of the substrate or a final shot of the substrate.

[Second Embodiment]

Figure 10:
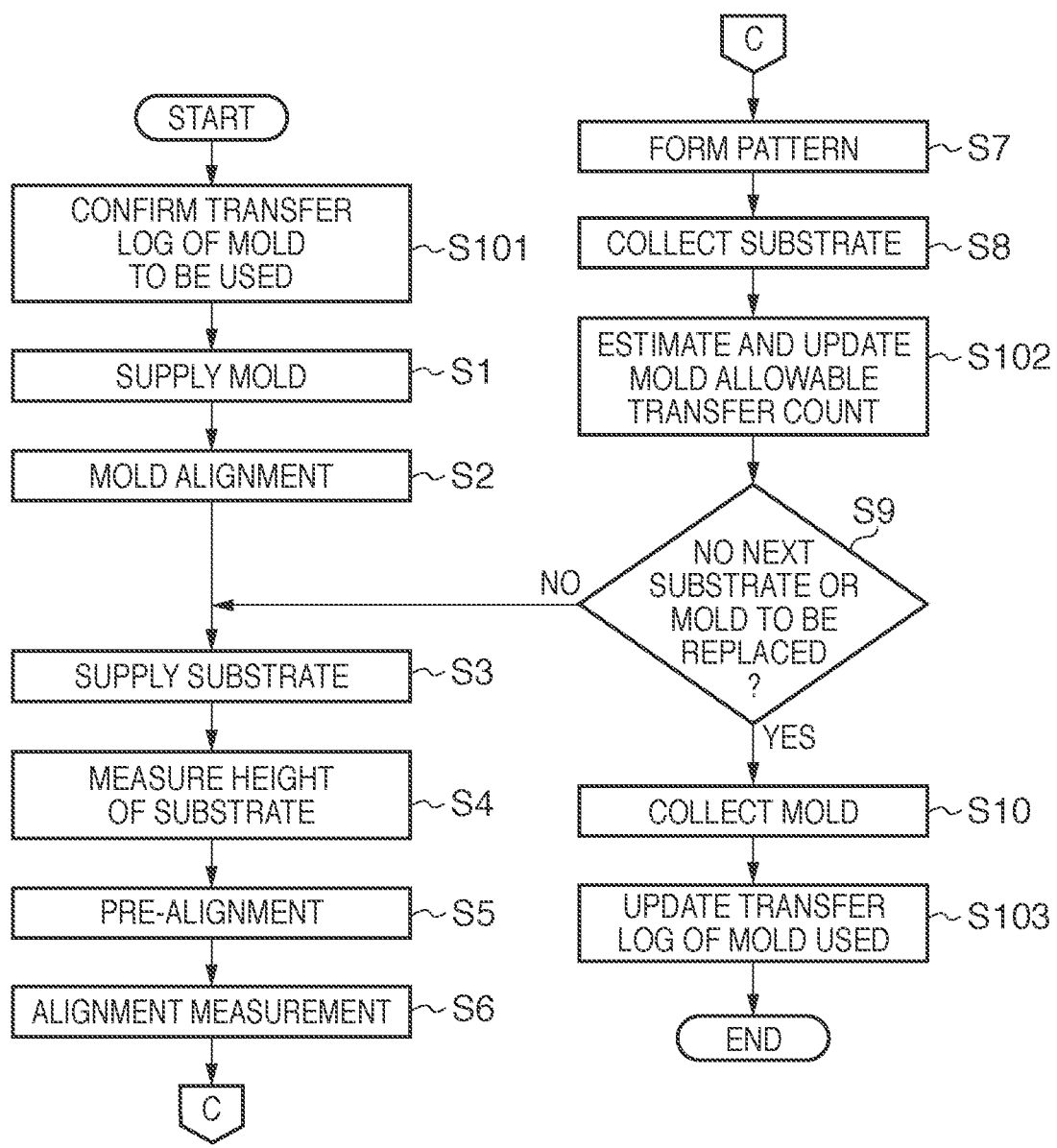
FIG. 10 is a flowchart for predicting a mold replacement timing.

The imprint operation of an imprint apparatus according to the second embodiment will be explained below with reference to FIG. 10. FIG. 10 is a flowchart of the second embodiment when performing the imprint operation by using the same mold for a plurality of substrates. The same reference numerals as in the flowchart of FIG. 4 denote steps having the same functions, and a repetitive explanation will be omitted. In FIG. 10, operations from S101 to S8 are the same as those shown in FIG. 4 of the first embodiment.

In S102 following S8, when the imprint operation for all shots of one substrate is complete, a CPU 100 estimates a first shot in which the release force exceeds a first threshold value Fmax, from the change in release force stored in a memory 110. Then, the CPU 100 calculates the number of shots until the first shot in which the release force exceeds the first threshold value Fmax, and determines the mold replacement timing. If the mold replacement timing comes during the imprint operation performed for a certain substrate, the CPU 100 determines to replace the mold before the imprint operation for the substrate is started.

Figure 11:
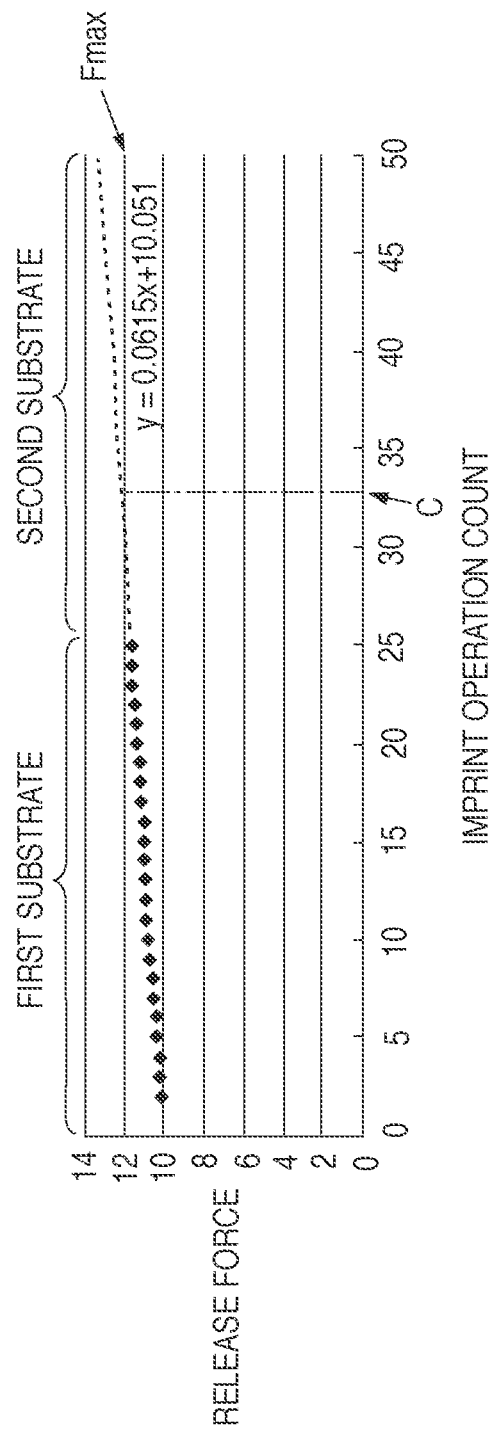
FIG. 11 is a graph for explaining a method of predicting the mold replacement timing.

A method of predicting the mold replacement timing will be explained below with reference to FIG. 11. FIG. 11 shows the change in release force when successively performing the imprint operation for 25 shots each for two, first and second substrates. The abscissa indicates the imprint operation count. Referring to FIG. 11, S102 described above is executed when the imprinting of 25 shots of the first substrate is complete. In this step, the CPU 100 approximates the change in release force for the 25 shots to a straight line or curve, thereby predicting the change in release force for 25 shots of the second substrate. FIG. 11 shows, by a broken line, the change in release force obtained by the approximation to a straight line, together with the approximate expression. Assume that the above-described first threshold value Fmax is set at 12. In this case, the predicted release force exceeds the first threshold value Fmax in 33rd imprinting (shot 8 of the second substrate) indicated by an alternate long and short dashed line C. That is, when the imprinting of a substrate 1 is complete, the number of imprintable shots is 7, which is smaller by 1 than 8. Since the number 7 of imprintable shots is smaller than 25 as the number of shots scheduled for the second substrate, it is determined in S102 that mold replacement is necessary before the imprint operation of the second substrate is started. As the result of this determination, although an explanation using the accompanying drawings will be omitted, a display unit 120 displays a message prompting mold replacement as in S803 explained with reference to FIG. 8. S9 and S10 following S102 are the same as those shown in FIG. 4.

Finally, in S103, the release force of releasing the mold used from each shot is additionally written in the memory 110, and the number of imprintable shots calculated and predicted in S102 for the finally transferred substrate is updated in the memory 110. Thus, the imprint operation for a plurality of substrates shown in FIG. 10 is complete.

The operation of the imprint apparatus when performing imprinting on a plurality of substrates is explained above with reference to FIGS. 4 and 10. Note that if it is determined in FIGS. 4 and 10 that mold replacement is necessary, it is also possible to automatically continue the imprint operation by using a new mold, while collecting a mold 10 from the imprint apparatus and cleaning the mold 10. This makes it possible to continuously perform the imprint operation for the same substrate or another substrate. Note also that the mold transfer log is saved and referred to by using the memory 110 in the embodiments, but the memory 110 need not be installed on the imprint apparatus. For example, it is also possible to separately prepare a database connected across a network in place of the memory 110, and share the mold transfer log by a plurality of imprint apparatuses.

In the present invention, as has been explained above, when performing an imprint operation for a plurality of shots on a substrate by the step-and-repeat method, the necessity of mold replacement can be determined while imprinting is performed on the substrate. Consequently, it is possible to prevent a defective shot due to pattern removal caused by deterioration of the mode releasability, and provide an imprint apparatus having a high yield. It is also possible to readily confirm a defective shot by a test after imprinting by determining an incomplete filling by comparing the release forces.

[Article Manufacturing Method]

A method of manufacturing a device (for example, a semiconductor integrated circuit element or liquid crystal display element) as an article includes a step of transferring (forming) a pattern onto a substrate (a wafer, glass plate, or film-like substrate) by using the above-described imprint apparatus. This manufacturing method can further include a step of etching the substrate having the transferred pattern. Note that when manufacturing another article such as a patterned medium (recording medium) or optical element, the manufacturing method can include another step of processing the substrate having the transferred pattern, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-004445, filed Jan. 12, 2010, which is hereby incorporated by reference herein in its entirety.

What is claimed is:

1. An imprint apparatus for performing, for each shot of a substrate, an imprint operation of coating the substrate with a resin, and curing the resin while the resin is in contact with a pattern surface of a mold, the apparatus comprising:
a support member configured to support the mold;
a substrate stage configured to support the substrate;
a detector configured to detect a force applied to the mold;
a mechanism configured to form a space for removing the mold supported by said support member, between said support member and said substrate stage;
a controller; and
a display unit,
wherein said controller is configured to:
determine a release force required to detach the mold from the cured resin, based on a detection result from said detector;
compare the determined release force with a first threshold value and cause said display unit to display a message prompting replacement of the mold, if the determined release force is larger than the first threshold value; and
compare the determined release force with a second threshold value smaller than the first threshold value, and determine that filling of the resin into the mold is incomplete and cause said display unit to display the determination result, if the determined release force is smaller than the second threshold value.

2. The apparatus according to claim 1, wherein said mechanism includes at least one of a driving mechanism which drives said support member or another driving mechanism which drives said substrate stage.

3. The apparatus according to claim 1, wherein:
if the imprint operation is performed for an entire region of a shot, said controller is configured to determine the force detected by said detector as the release force, and
if a shot partially extends from an edge of the substrate and the imprint operation is performed for a partial region of the shot, which is coated with the resin, said controller is configured to calculate the release force by using the force detected by said detector, and a ratio of an area of the partial region coated with the resin to an area of the shot.

4. The apparatus according to claim 1, further comprising:
a storage unit which stores the determined release force,
wherein said controller is configured to determine a replacement timing of the mold by estimating a first shot in which the release force exceeds the first threshold value, based on a change in release force stored in said storage unit.

5. The apparatus according to claim 4, wherein if said controller estimates that the release force exceeds the first threshold value while the imprint operation is performed for a plurality of shots of subsequent substrate, said controller is configured to determine that the mold needs to be replaced before the imprint operation for the subsequent substrate is started.

6. An article manufacturing method comprising the steps of:
forming a pattern on a substrate by using an imprint apparatus which performs, for each shot of the substrate, an imprint operation of coating the substrate with a resin, and curing the resin while the resin is in contact with a pattern surface of a mold; and
processing the substrate on which the pattern is formed in the preceding step,
wherein the imprint apparatus comprises:
a support member configured to support the mold;
a substrate stage configured to support the substrate;
a detector configured to detect a force applied to the mold;
a mechanism configured to form a space for removing the mold supported by the support member, between the support member and the substrate stage;
a controller; and
a display unit,
wherein the controller is configured to:
determine a release force required to detach the mold from the cured resin, based on a detection result from the detector;
compare the determined release force with a first threshold value and cause the the display unit to display a message prompting replacement of the mold, if the determined release force is larger than the first threshold value; and
compare the determined release force with a second threshold value smaller than the first threshold value, and determine that filling of the resin into the mold is incomplete and cause the display unit to display the determination result, if the determined release force is smaller than the second threshold value.

7. An imprint apparatus for curing a resin with which a substrate is coated, while the resin is in contact with a pattern surface of a mold, the apparatus comprising:
a detection unit configured to detect a force applied to the mold;
a display unit; and
a controller configured to:
determine a release force required to detach the mold from the cured resin, based on a detection result from said detection unit;
compare the determined release force with a first threshold value and cause said display unit to display a message prompting replacement of the mold, if the determined release force is larger than the first threshold value; and
compare the determined release force with a second threshold value smaller than the first threshold value, and determine that filling of the resin into the mold is incomplete and cause said display unit to display the determination result, if the determined release force is smaller than the second threshold value.

\* \* \* \* \*